United States Patent [19]

Mettler, Jr.

[11] Patent Number: 4,567,545
[45] Date of Patent: Jan. 28, 1986

[54] INTEGRATED CIRCUIT MODULE AND METHOD OF MAKING SAME

[76] Inventor: Rollin W. Mettler, Jr., 4 Tumblebrook Ct., Cheshire, Conn. 06410

[21] Appl. No.: 495,693

[22] Filed: May 18, 1983

[51] Int. Cl.[4] .......................... H05K 1/18; H05K 7/02; H01J 5/00
[52] U.S. Cl. .................................... 361/401; 361/409; 361/421; 174/50.5; 174/52 FP
[58] Field of Search ............... 361/401, 421, 392, 395, 361/397, 398, 399, 400, 419, 409; 174/50.5, 50.51, 50.53, 50.54, 50.64, 52 PE, 52 FP; 29/827, 829, 831, 841; 339/17 LC, 17 N; 357/70

[56] References Cited

U.S. PATENT DOCUMENTS

| | | | |
|---|---|---|---|
| 3,404,215 | 10/1968 | Burks et al. | 361/409 X |
| 3,544,857 | 12/1970 | Byrne et al. | 29/841 X |
| 3,641,401 | 2/1972 | Lynch | 174/52 FP X |
| 3,693,252 | 9/1972 | Robertson et al. | 174/52 PE X |
| 3,697,666 | 10/1972 | Wakley et al. | 174/50.64 X |
| 3,930,115 | 12/1975 | Uden et al. | 361/400 X |
| 3,934,336 | 1/1976 | Morse | 29/827 |
| 4,079,511 | 3/1978 | Grabbe | 174/52 PE X |
| 4,105,861 | 8/1978 | Hascoe | 174/52 FP |
| 4,413,309 | 11/1983 | Takahashi et al. | 361/409 X |

FOREIGN PATENT DOCUMENTS 623183  5/1981  Switzerland .................. 361/401

Primary Examiner—Vit W. Miska
Attorney, Agent, or Firm—DeLio & Associates

[57] ABSTRACT

An integrated circuit module adapted to connect an integrated circuit to an electrical connector. A lead frame (20) with lengthened leads (22), compared to the lead frame of a conventional DIP packaged IC, is laminated to a nonconductive substrate (46). The leads (22) of the lead frame have contact ends (28) laminated in spaced relation along a contact edge (52) of the substrate (46) for contacting the electrical connector. The use of a printed circuit board and the necessity for soldering the IC thereto are thereby eliminated.

The leads (22) may comprise two sets (48,54) with the first set (48) laminated to a first surface (50) of the substrate (46) and the second set (54) wrapped around an edge of the substrate (46) and laminated to the second surface (56). The IC module may include a hermetically sealed IC chip (26) electrically connected to the lead frame (20) with interconnecting wires (22) and substrate (46) may be shaped to allow external electrical components to be mounted on the IC module. The method of making the IC module is also provided.

30 Claims, 16 Drawing Figures

INTEGRATED CIRCUIT MODULE AND METHOD OF MAKING SAME

TECHNICAL FIELD

This invention relates to integrated circuit modules for connecting an integrated circuit chip to an electrical connector.

In a variety of electrical equipment which use integrated circuits it is desireable to use different integrated circuits within the circuitry of the equipment at different times. For example, home television computer games use a read only memory (ROM) integrated circuit (IC) which stores data and instructions for use by the master game unit. The ROM is connected to the master game unit through an electrical connector.

The master TV game unit normally includes those portions of the electrical circuitry which are always required when the unit is operated, regardless of the particular television game being played, while the ROM contains data and instructions for a particular game. The data and instructions vary from game to game, and thus the game can be changed merely by unplugging the integrated circuit from the electrical connector and replacing it with a new one containing different data and instructions for the new game. The frequency with which the integrated circuit is changed requires that the IC be mounted on a sturdy substrate of a convenient size for handling and containing electrical contacts suitably rugged for connection to the electrical connection.

Integrated circuit modules which may be readily changed or replaced are useful in a variety of other applications which are well known.

BACKGROUND ART

In the conventional manufacture of integrated circuit modules such as are described above, the module is constructed in two separate phases. In the first phase, an IC manufacturer fabricates an IC chip of a very small size which is then mounted in a larger package containing protruding leads to be soldered to a printed circuit board (PC board). The most commonly used package is a dual in-line pin package (DIP). The IC chip prior to packaging is of such a small size that electrical connections are made to it with a wire-bonding apparatus which utilizes a microscrope to locate the proper contact points on the IC chip. During manufacture, the IC chip is mounted on a conductive lead frame, the electrical interconnections between the chip and the lead frame are then made with the wire-bonding unit, and the chip is hermetically sealed in an encapsulating medium. The leads of the lead frame in the DIP package protrude a short distance out of the encapsulating medium and are then bent down so that they may be soldered to a PC board during final assembly of the IC module.

In phase 2 of the assembly, a PC board of the required shape is manufactured requiring the well known steps of masking a copper-plated substrate and etching the copper away from the unmasked portions of the board to produce the required printed circuitry. The contact edge of the board is shaped for insertion into a PC board edge connector, and during etching the circuit board is provided with copper lands in spaced relation along the contact edge for contacting the electrical connector. The circuit board is then drilled to accept the leads from the DIP package containing the desired IC. The IC is then inserted and soldered to the PC board.

While quite suitable for moderate volume production of integrated circuit modules, this conventional two-phase manufacturing process of the IC module requires a large number of individual steps which may be eliminated by the use of the present invention. For example, it will be noted that the IC chip is first electrically connected to the lead frame in phase 1, and then the lead frame is soldered to the PC board in phase 2, whereas in the present invention the second step in this method is eliminated, and no soldering is required.

DISCLOSURE OF INVENTION

In accordance with the present invention, an integrated circuit module adapted to connect an IC chip to an electrical connector is provided comprising a non-conductive substrate having a contact edge for connection to the electrical connector, and a conductive lead frame having a plurality of leads laminated to a first surface of the substrate, the leads having inner tips for connection to the IC chip and outer contact ends for contacting the electrical connector laminated in spaced relation along the contact edge of the substrate.

In one embodiment of the invention, a first set of leads of the lead frame are laminated to a first surface of the substrate, and a second set of leads are wrapped around an edge of the substrate and laminated to the second surface of the substrate, the contact ends of the first and second set of leads being laminated in spaced relation to the first and second surfaces respectively along the contact edge. The contact ends of the leads in the lead frame are thereby presented along the contact edge of the substrate for contacting the electrical connector.

The contact ends of the leads may be wider than the remaining portions of the leads to provide a larger contact surface for contacting the electrical connector.

The IC module may be constructed with only the substrate and the lead frame laminated thereto for subsequent mounting of an IC chip, or it may include the IC chip, means for electrically connecting the IC chip to the inner tips of the leads in the lead frame, and means for hermetically sealing the IC chip.

In one embodiment of the invention, the IC chip is electrically connected to the inner tips of the leads in the lead frame and hermetically sealed with an encapsulating medium surrounding the IC chip. The first surface of the substrate may include a depression formed therein which receives the portion of the encapsulating medium which lies below the first set of leads thereby permitting the first set of leads to lie flat along the first surface of the substrate.

In another embodiment of the invention, a depression for holding the IC chip is formed in the substrate and the inner tips of the leads are bent down into the depression. The IC chip may be mounted within the depression, electrically connected to the inner tips of the leads in the lead frame, and hermetically sealed therein.

The hermetic sealing of the IC chip within the depression may be accomplished by placing a sealing member over the top of the depression and sealing it to the first surface of the substrate around the perimeter of the depression.

The depression may be formed of two separate levels to permit the inner tips of the leads to be mounted at the first level, and the IC chip to be mounted at the second level with its upper surface substantially coplaner with the inner tips of the leads.

A method of fabricating the integrated circuit module described above is also provided in accordance with this invention comprising the steps of (a) forming a noncoductive substrate having a first surface and a contact edge for connection to the electrical connector, (b) positioning a conductive lead frame having a plurality of leads with inner tips for connection to the IC chip and outer contact ends for contacting the electrical connector on the first surface of the substrate with the contact ends of the leads in spaced relation along the contact edge of the substrate, and (c) laminating the leads to the first surface of the substrate.

The method may also include the steps of mounting an IC chip on the lead frame, electrically connecting the IC chip to the inner tips of the leads in the lead frame, and hermetically sealing the IC chip.

The method of fabricating the different embodiments of the integrated circuit module described above is also disclosed.

In another embodiment of the integrated circuit module, the lead frame includes at least one lead having a means for mounting an external electrical component. The means for mounting the electrical component may comprise a contact pad laminated to the substrate with a hole through the contact pad and the substrate for the reception of a lead of the external electrical component.

This invention possesses the advantage that many of the steps required in the production of a printed circuit board are eliminated. The lead frame instead of comprising short leads which must be soldered to a PC board, comprises longer leads which are directly laminated to the substrate to replace the lands on the printed circuit board. The masking and etching steps required in producing a PC board are thereby eliminated and the PC board copper lands are replaced by an appropriately shaped lead frame laminated to a nonconductive substrate.

In accordance with this invention, the integrated circuit may be packaged in a package similar to a DIP package wherein the leads of the lead frame have been lengthened to permit them to be laminated to the substrate and extend to the contact edge for connection to the electrical connector.

When the packaging operation is accomplished first, i.e., when the IC chip is electrically connected to the lead frame and hermetically sealed prior to the laminating, the substrate may be provided with a depression to accommodate the portion of the encapsulating medium which lies below the inner tips of the leads thereby permitting the lead frame to lie flat along the surface of the substrate. This particular embodiment is especially suited for use where an integrated circuit manufacturer is going to produce the encapsulated IC chip mounted on the lead frame prior to the final assembly of the IC module. The IC chip can be manufactured in a DIP package with lengthened leads which may subsequently be laminated to a substrate to produce a complete IC module.

In another embodiment, the IC module may be constructed with the IC chip mounted directly within a depression on the surface of the substrate, with a sealing member positioned over the depression whereby the sealing member acting with the substrate forms a hermetic seal around the IC chip.

One skilled in the art will note that the lead frame in this invention performs the function of the etched lands on a PC board. Furthermore, the lead frame may be manufactured in any desired pattern. Consequently, if it is desired to mount external components in addition to the IC chip, the lead frame may be provided with means for mounting external components before the leads are laminated to the surface of the substrate.

BEST MODE FOR CARRYING OUT THE INVENTION

Figure 1:
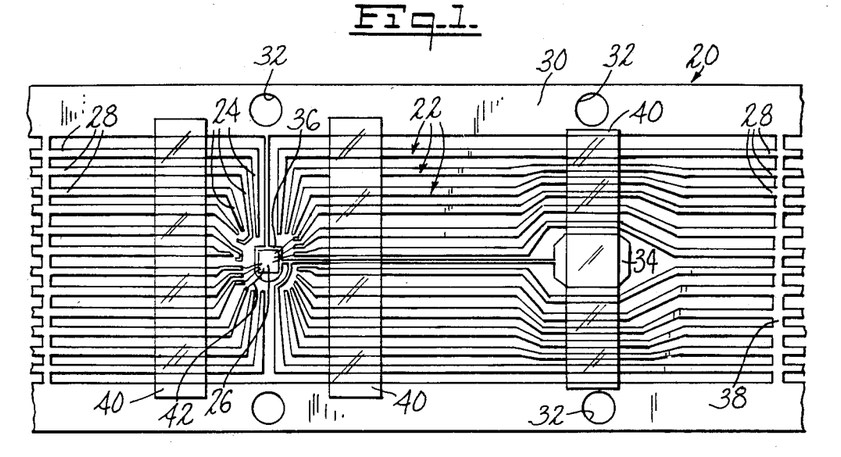
FIG. 1 is a top plan view of the lead frame used in the manufacture of one embodiment of this invention.

Referring to the drawings, FIG. 1 shows a lead frame 20 for use in the present invention. The lead frame includes a plurality of leads 22. The leads 22 have inner tips 24 for connection to an IC chip 26, and outer contact ends 28 for contacting an electrical connector. The lead frame 20 includes carrier strips 30 with pilot holes 32 to assist in accurately positioning and manufacturing the lead frame.

The lead frame 22 also includes a shield means 34 and a mounting base 36 for the IC chip which may be seen in FIG. 1.

The leads 22 in the lead frame 20 are supported along their contact ends 28 by a transverse portion 38 which will ultimately be removed with the carrier strip as will be described below. The leads 22 are supported along their length by nonconductive mylar strips 40.

The lead frame may be manufactured with a greater or lesser number of leads than are shown in FIG. 1 and the shape of the leads and their positioning may be varied to suit particular applications. The lead frame 20 is made of an electrically conductive material as is well known in the art.

FIG. 1 also shows an IC chip 26 mounted on the IC mounting base 36. A means for electrically connecting the IC chip to the inner tips 24 of the leads in the lead frame is provided which may consist of interconnecting wires 42, wire bonded to the IC chip in a conventional manner, and electrically connecting the inner tips 24 of the leads in the lead frame to the IC chip. For the sake of clarity, some of the interconnecting wires 42 have been omitted.

Figure 2:
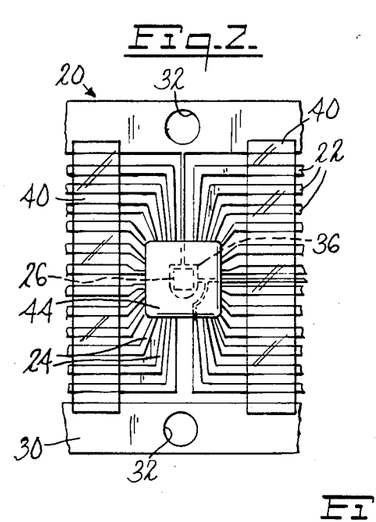
FIG. 2 is a top plan view of a portion of the lead frame of FIG. 1 after the IC chip has been encapsulated.

Referring to FIG. 2, a portion of the lead frame shown in FIG. 1 can be seen after a means for hermetically sealing the IC chip has been added to the lead frame. In the particular embodiment shown, the means for hermetically sealing the IC chip comprises an encapsulating medium 44 which surrounds the IC chip.

The IC chip 26 is mounted on the mounting base 36 and connected to the inner tips 24 of the leads with interconnecting wires 42, and the chip is then hermetically sealed with an encapsulating medium 44 as shown in FIG. 2.

Figure 3:
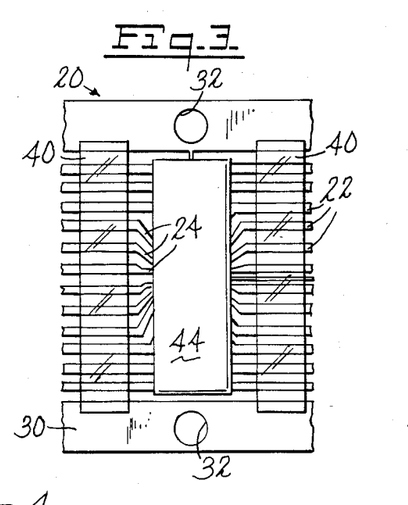
FIG. 3 is a top plan view of another embodiment of the lead frame shown in FIG. 2, illustrating that a larger section of the lead frame may be encapsulated.

FIG. 3 shows the same structure seen in FIG. 2 with a larger portion of the lead frame 20 enclosed in the encapsulating medium 44.

Those familiar with the art will recognize the similarity between the encapsulated IC chip and lead frame seen in FIG. 3 and a conventional DIP IC package. The lead frame in FIG. 3, however, includes the substantially lengthened leads 22 and the shield means 34 in FIG. 1.

Figure 4:
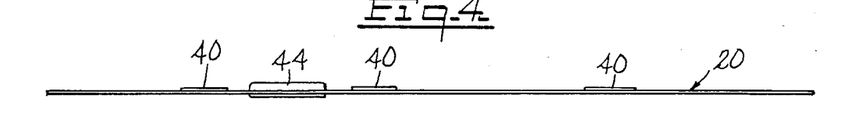
FIG. 4 is a side elevational view of the lead frame shown in FIG. 1 showing the thickness of the lead frame and encapsulating medium.

Referring to FIG. 4, a side elevational view of the integrated circuit module of FIG. 1 can be seen. It will be noted that a portion of the encapsulating medium 44 extends below, as well as above, the innter tips 24 of the lead frame. The structure shown in FIG. 4, with the exception of the extended length of the leads 22 in the lead frame, is comparable to an intermediate step in the production of an IC chip in a DIP package before the short leads in the DIP package are bent downwards for insertion into a PC board. The structure shown in FIG. 4 may be manufactured with conventional equipment.

Figure 5:
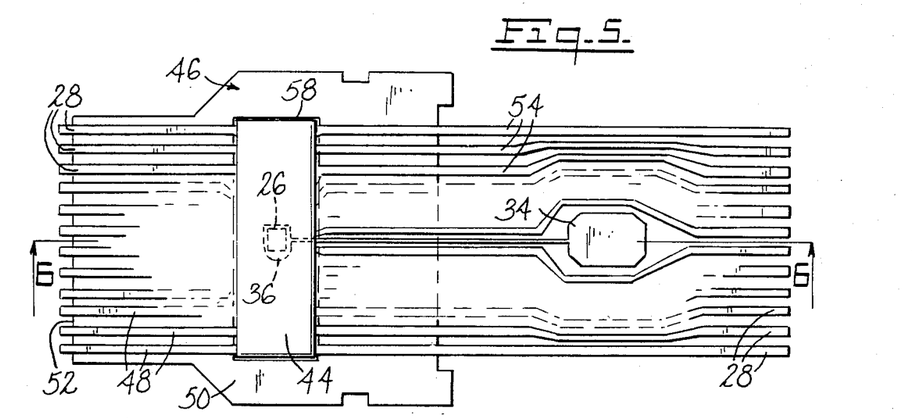
FIG. 5 is a top plan view of the lead frame shown in FIG. 3 with the carrier strips removed and the lead frame positioned on the nonconductive substrate.

FIG. 5 shows the lead frame of FIG. 3 with the carrier strips 30, transverse portions 38 of the lead frame 20, and mylar strips 40 removed. The lead frame 20 is positioned over a nonconductive substrate 46. The substrate may be formed of any convenient nonconductive material suitable for use as a base in a printed circuit-board, such as plastic or epoxy impregnated fiberglass.

A first set 48 of the leads 22 in the lead frame 20 is laminated to a first surface 50 in spaced relation along the contact edge 52 of the substrate 46.

Figure 6:
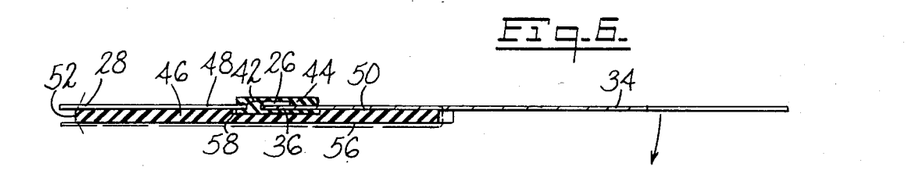
FIG. 6 is a side sectional view taken along the line 6—6 shown in FIG. 5.

A second set of leads 54 may be seen extending to the right of the substrate 46 before they are wrapped around the edge of the substrate 46 and laminated to the second surface 56 of the substrate which may be seen in FIG. 6.

FIG. 6 shows a sectional view along the line 6—6 shown in FIG. 5. Nonconductive substrate 46 may include a depression 58 dimensioned to accommodate the portion of the encapsulating medium 44 which extends below the inner tips 24 of the lead frame 20. Depression 58 in substrate 46 permits the lead frame to lie flat along the plane of the first surface 50 of the substrate.

FIG. 6 also shows in dashed outline form, the position that the second set of leads 54 will assume after they are wrapped around the edge of the substrate 46 and laminated to the second surface 56 of the substrate 46.

The contact edge 52 of the substrate may be wedge shaped to facilitate the insertion of the contact edge 52 into an electrical connector to contact the contact ends 28 of the first and second set of leads.

Figure 7:
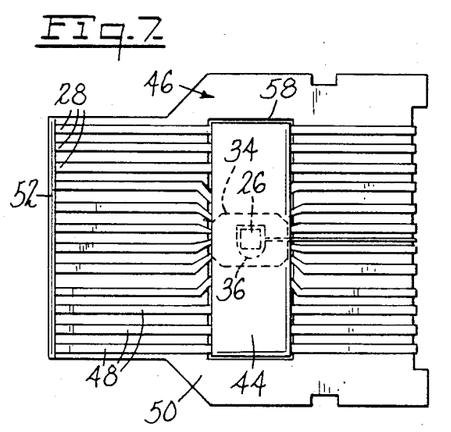
FIG. 7 is a top plan view of the integrated circuit module shown in FIG. 5 after the second set of leads has been wrapped around the edge of the substrate and positioned on the second surface of the substrate.

FIG. 7 shows the integrated circuit module after the leads 22 have been laminated to the surface of the substrate 46 and the contact ends 28 of the leads have been trimmed along the contact edge 52.

The integrated circuit module seen in FIG. 7 is now ready for insertion into a PC board edge connector which contacts the leads 22 of the lead frame 20 at their contact ends 28 along the contact edge 52 of the substrate 46.

It may be seen in FIG. 7 that the shield means 34 is positioned beneath the IC chip where it is laminated to the second surface 56 of the substrate. Shield means 34 provided electrical shielding of the IC chip from other nearby electrical circuitry.

The leads 22 may be laminated to the surface of the substrate by means of an adhesive such as an epoxy or contact cement and/or the leads may be bonded and laminated to the surface under heat or pressure.

Figure 8:
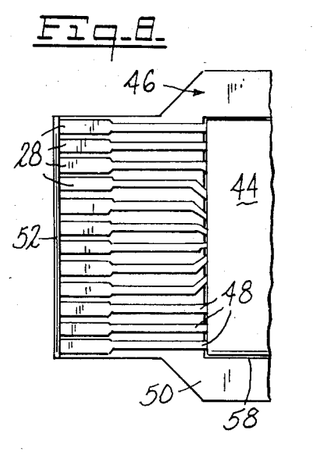
FIG. 8 is a top plan view of a portion of an alternative embodiment of the IC module shown in FIG. 7 wherein the contact ends of the leads have been widened.

Referring to FIG. 8, an alternative embodiment of the IC module can be seen, wherein the contact ends 28 have been substantially widened to provide an increased contact area for contacting the electrical connector.

The positioning and dimensioning of the contnact ends 28 of the leads in the lead frame, and the dimensions of the substrate 46 and the contact edge 52 may be varied to accomodate different sizes and shapes of electrical connectors.

Referring again to FIGS. 1-7 a method of fabricating the integrated circuit modules seen in final form in FIG. 7 can be understood. The lead frame 20 shown in FIG. 1 has an IC chip 26, mounted thereon, and the IC chip 26 is connected with interconnecting wires 42, to the inner tips 24 of the leads 22 of the lead frame 20.

The IC chip is then hermetically sealed with an encapsulating medium 44 as seen in FIG. 3.

The lead frame and encapsulated IC may then be positioned over a substrate 46 containing a depression 58 for the reception of the portion of the encapsulating medium 44 below the inner tips 24 of the lead frame 20. The carrier strips 30, the transverse portions of the lead frame 38, and the nonconducting mylar support strips 40 are then removed from the lead frame 20. The lead frame is then laminated to the first surface 50 of the substrate with the contact ends 28 laminated in spaced relation along the contact edge 52 of the substrate. The second set of leads 54 may then be wrapped around the edge of the substrate 46 and laminated to the second surface 56 with the contact ends 28 of the second set of leads 54 also laminated in spaced relation along the contact edge 52 of the substrate.

The contact edge 52 may then be shaped and the protruding portions of the contact ends 28 of the leads may be trimmed off. Lamination of the leads to the substrate may be accomplished by the use of adhesive and/or heat and pressure.

Figure 9:
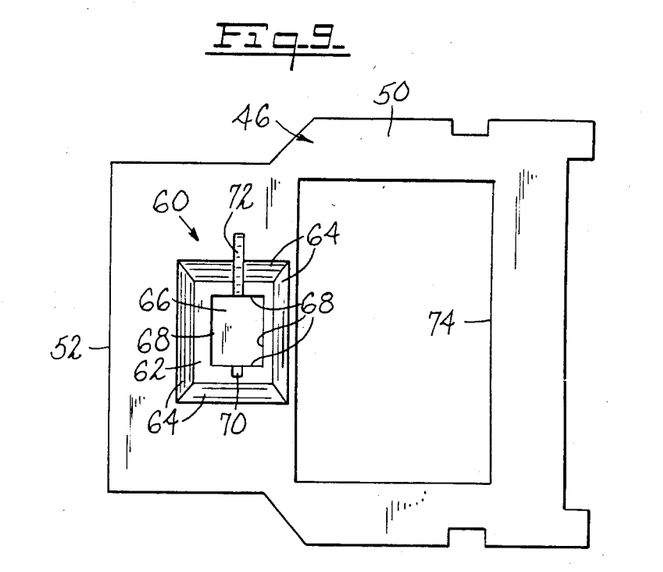
FIG. 9 is a top plan view of an alternative embodiment of the nonconductive substrate.

Referring now to FIG. 9 a second form for the nonconductive substrate 46 may be seen used in fabricating a second embodiment of this invention. The substrate 46 as seen in FIG. 9 has the same outer perimeter as the substrate 46 seen in FIG. 5 so that this second embodiment of the invention, in its final form, may be used interchangeably with the first embodiment as seen in FIG. 7. It will be noted that the shape of the substrate 46 may be varied to suit particular applications. A wide variety of lead shaped may be employed, and the substrate 46 may be shaped as desired to contact different types of electrical connectors.

The contact edge 52 of the substrate 46 must be shaped to fit an electrical connector, and at least one surface of the substrate must be sufficiently smooth to permit the leads 22 of the lead frame 20 to be laminated thereon. The term "laminate" or "lamination" as used herein refers to the process of bonding at least some portion of the lead frame to the surface of the substrate, and does not require any additional layers of material of any covering film or material.

Substrate 46, seen in FIG. 9, has a two level depression 60 formed on the first surface 50 of the substrate 46. The first level 62 is the shallowest portion of the depression and is connected to the first surface 50 with sides 64 which slope upwards toward the first surface 50.

The second level of the depression 66 is the deepest portion of the depression and is connected around the majority of its perimeter with vertical sides 68 to the first level of the depression 62. The first level 62 forms a shelf around the perimeter of the deeper second level 66. The second level 66 of the depression is suitably sized to accomodate an IC chip.

The second level of the depression 66 is also connected to the first level 62 with a steeply sloping ramp 70 and to the first surface 50 by a shallow sloping ramp 72.

Substrate 46 also includes a large central hole 74 which, as will be described herein, permits the leads of the lead frame to be shortened but still wrapped around an edge of the substrate and laminated to the second surface 56.

Figure 10:
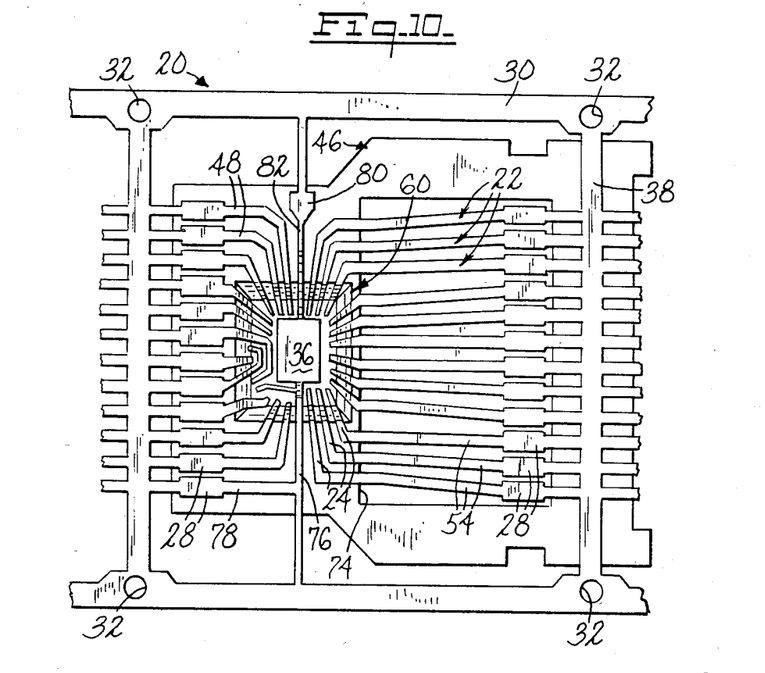
FIG. 10 is a top plan view of the nonconductive substrate of FIG. 9 with a lead frame positioned above.

In FIG. 10 a second form of the lead frame 20 can be seen positioned above the substrate 46. This lead frame also includes carrier strips 30, pilot holes 32, transverse support portions 38, and although not shown, it may or may not include additional nonconductive mylar support strips 40.

The inner tips 24 of the leads 22 of the lead frame are bent down into the depression 60 and laminated to the sloping side 64 and the first level 62 of the depression.

The lead frame 20 also includes an IC mounting base 36 connected to lead frame 20 by means of lead 76. The IC mounting base is laminated to the second level 66 of the depression 60 and lead 76 rises out of the depression 60 on steeply sloping ramp 70, across the first level 62 of the depression, and up the shallow sloping sides 64 where it is connected to lead 78 for presentation along the contact edge 52 of the substrate. IC mounting base 36 is also connected to a contact pad 80 by means of lead 82 which rises out of the second level 66 of the depression on ramp 72. It will be noted that the inner tips 24 of the lead, may be variously shaped as required for contacting the IC chip.

Figure 11:
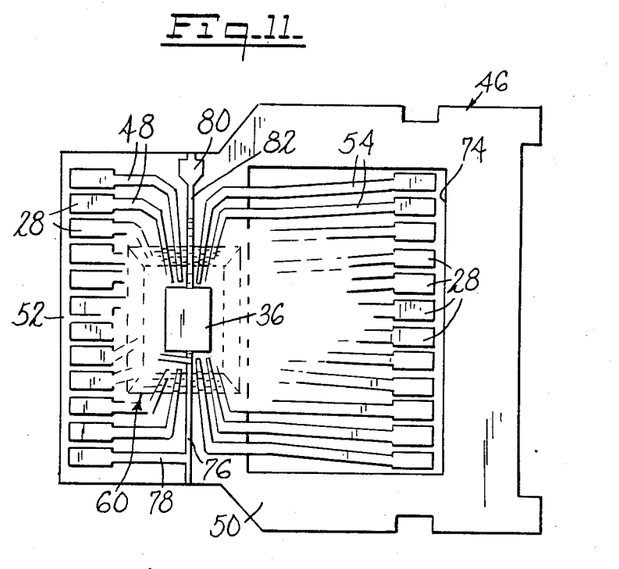
FIG. 11 is a top plan view of the IC module shown in FIG. 10 with the carrier strip removed from the lead frame.

Referring to FIG. 11, the IC module of FIG. 10 can be seen with the carrier strips 30 and the transverse portions 38 of the lead frame removed. At this stage the first set of leads 48 has been laminated to the first surface 50 of the substrate.

Figure 12:
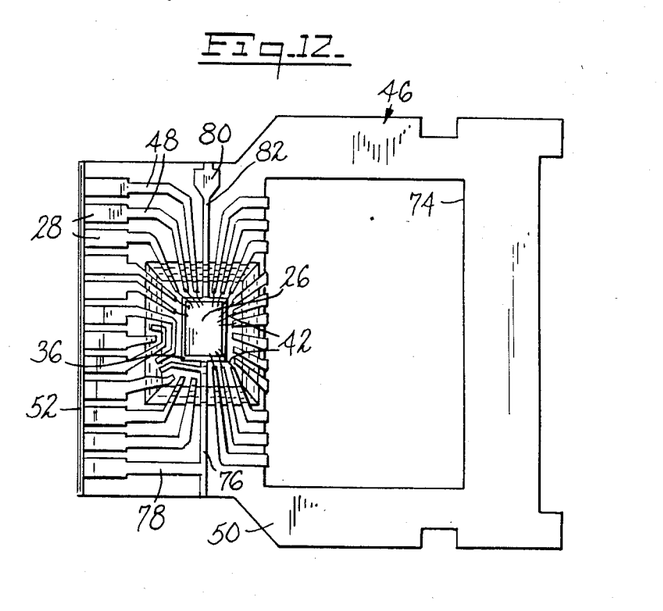
FIG. 12 is a top plan view of the integrated circuit module shown in FIG. 11 with the second set of leads wrapped around an edge of the substrate and laminated to the second surface of the substrate.

FIG. 12 shows the second set of leads 54 after they have been wrapped through the hole 74 in the substrate and laminated to the second surface 56.

An IC chip 26 mounted on the mounting base 36 can also be seen in FIG. 12, and interconnecting wires 42 are shown electrically connecting the IC chip 26 to the inner tips 24 of the leads in the lead frame. The depth of the first level 62 and the second level 66 of the depression 60 are preferably chosen to place the upper surface of the IC chip 26 in the same plane as the portions of the inner tips 24 of the leads which are mounted on the first level 62 of the depression. This permits the wire bonding machine used to electrically connect the IC chip 26 and the inner tips of the leads 24 to move directly from the IC chip to the lead without changing the level at which the wire bonds are formed, which results in a substantial increase in the speed at which the electrical connections can be made. The depth of the first level 62 of the depression is preferably chosen sufficiently deep so that the IC chip 26, the inner tips of the leads 24, and the interconnecting wires 42 all lie below the perimeter of the depression 60.

Figure 13:
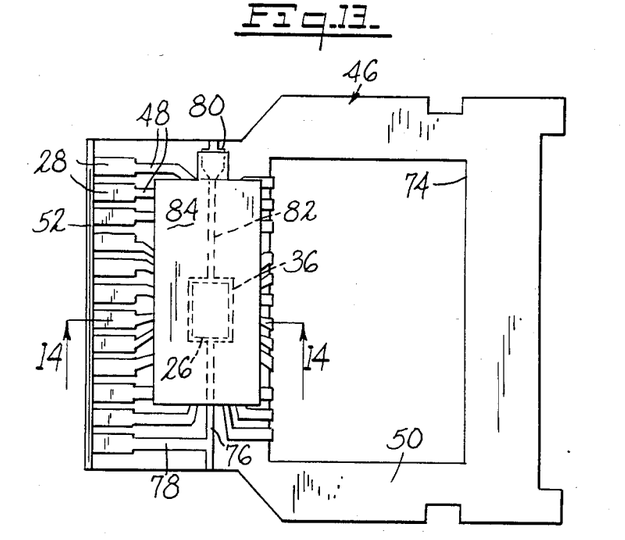
FIG. 13 is a top plan view of the finished integrated circuit module shown in FIG. 12.

Referring now to FIG. 13, the IC module in its completed form can be seen. A means for hermetically sealing the IC chip is shown which comprises a sealing member 84 positioned over the top of the depression 60 and hermetically sealed to the first surface of the substrate 50 around the perimeter of the depression 60. In the preferred embodiment, sealing member 84 comprises a conductive plate bent down and connected to the contact pad 80 to provide electrical shielding above the IC chip 26. To avoid shorting out the leads of the lead frame around the perimeter of the depression 60, a nonconductive adhesive 86, seen more clearly in FIGS. 14 and 15, is used to hermetically seal the plate 84 around the perimeter of the depression.

Figure 14:
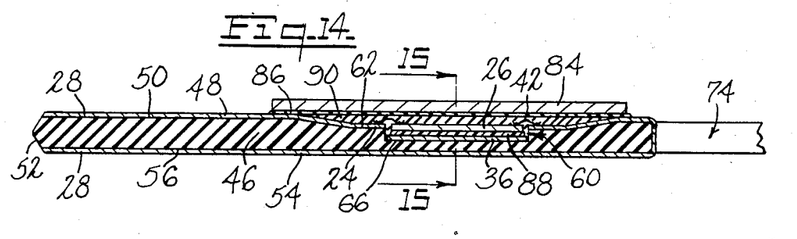
FIG. 14 is a side sectional view of the integrated circuit module along the line 14—14 seen in FIG. 13.
Figures 15, 16:
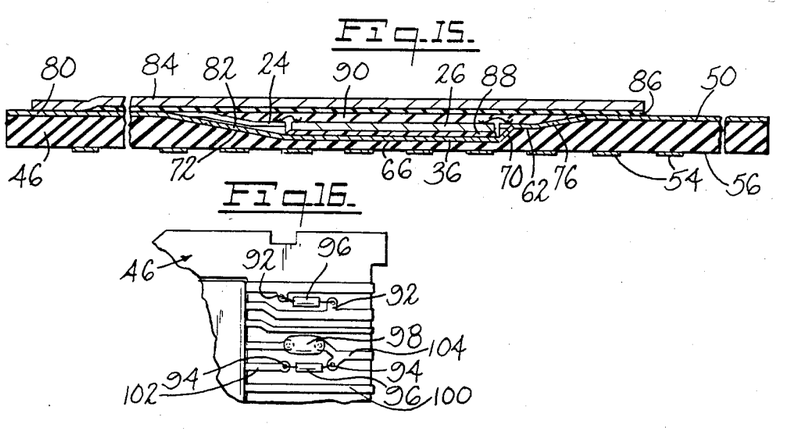
FIG. 15 is a front sectional view of the integrated circuit module along the line 15—15 seen in FIG. 14.
FIG. 16 shows a portion of the integrated circuit module of FIG. 7 with external electrical components mounted on the substrate and connected to the leads of the lead frame.

FIG. 14 is drawn to a larger scale for clarity, and shows a sectional view along the line 14—14 of FIG. 13. The nonconductive adhesive 86 electrically isolates the conducting plate 84 from the leads 20 as they pass out of the depression 60 and underneath the conducting plate 84.

IC chip 26 is electrically connected to the mounting base 36 with a conductive material 88 such as a conductive adhesive or eutectic bonding material.

The upper surface of the inner tips of the leads 24 is seen to be coplanar with the upper surface of the IC chip 26. A nonconductive filling material 90 fills the depression 60 below the conductive plate 84.

The wedge-shaped contact edge 52 facilitates the insertion of the contact edge into the electrical connector.

FIG. 15 is a sectional view along the line 15—15 in FIG. 14. This view shows the conductive plate 84 bent down into contact with the contact pad 80.

Lead 82, connected to the contact pad 80, can be seen angling down to the second level 66 of the depression along the shallow ramp 72. Lead 76 angles down from the first level 62 of the depression on the steep ramp 70 to contact the mounting base 36 mounted on the second level 66. The second set 54 of leads can be seen laminated to the second surface 56 of the substrate.

It should be noted that the IC modules shown in FIG. 7 and FIG. 13 include the IC chip 26 and a means for hermetically sealing the IC chip. It is within the scope of this invention, however, to manufacture the IC module without the IC chip 26 and hermetic seal. The IC module without the IC chip may be manufactured and stored for subsequent final assembly with a particular IC chip.

The method of manufacturing the embodiment of the IC module shown in FIG. 13 may be described with reference to FIGS. 9-15. The nonconductive substrate 46 shown in FIG. 9 may be formed having a contact edge 52, a first surface 50, and a two level depression 60. The two level depression is formed having first level 62 and a deeper second level 66 for reception of the IC chip.

The conductive lead frame 20 is positioned on the first surface 50 of the substrate as shown in FIG. 10, with the contact ends 28 of the first set of leads 48 being positioned in spaced relation along the contact edge 52 of the substrate. The inner tips of the leads 24 are then bent down into the depression 60 and positioned on the first level 62 of the substrate.

The IC mounting base 36 is pressed down into the depression 60 and positioned on the second level 66 of the depression.

The portions of the lead frame in contact with the substrate 46 are then laminated thereto. The carrier strips 30 and transverse support portions 38 are then removed from the lead frame producing the form shown in FIG. 11.

The second set of leads 54 may then be wrapped around an edge of the substrate and properly positioned on the second surface 56 of the substrate and laminated thereto.

For final assembly, a selected IC chip may be bonded to the IC mounting base 36 with a conductive material 88. The inner tips of the leads 24 may then be electrically connected to the IC chip 26 with interconnecting wires 42.

The entire depression 60 may then be filled with a nonconductive filling material 90. A nonconductive adhesive 86 may then be applied over the filled depression 60 and filling material 90. The sealing member 84 may then be uesd to hermetically seal the IC chip within the depression as it is bonded to the first surface 50 of the substrate by the nonconductive adhesive 86. The nonconductive adhesive 86 is not applied to the contact pad 80, and the sealing member 84, which preferably consists of a conductive plate is then bent down into contact with the contact pad 80 as may be seen in FIG. 15.

Referring now to FIG. 16 another embodiment of the invention may be seen. One skilled in the art will recognize that the lead frame 20 in the present invention replaces the conductive material in a conventional printed circuit board. Because the shape of the lead frame 20 may be selected in advance, the leads of the lead frame may have integral means for mounting external electrical components formed as a portion thereof.

In FIG. 16, the means for mounting external electrical components consists of contact pads 92 with holes 94 contained therein and extending through the substrate 46. With the proper placement of these contact pads, external components such as the resistors 96 and capacitor 98, shown in FIG. 16, may be conveniently mounted. For ease of illustration, FIG. 16 shows the electrical components mounted on the same side of the substrate as the leads containing the contact pads 92, however in a more conventional mounting arrangement, the components will be mounted on the opposite side of the substrate 46 from the leads containing the contact pads 92. It will be noted that some leads from the lead frame, such as lead 100, connect the IC chip to the electrical connector, whereas other leads, such as lead 102, connect the IC chip to an external component. Leads such as lead 104 may interconnect the electrical components or connect the components and/or the IC chip through the components to the electrical connector.

Although the embodiments illustrated in the drawings show the use of a two sided substrate with leads laminated to a first and second surface, it is within the scope of this invention to laminate the leads to a single surface. The lead frame may also be of a more intricate shape to simulate a large printed circuit board, and it is also possible for the lead frame to provide for the mounting of more than one IC chip 26.

The lead frame 20 has been shown throughout the drawings to be formed of a conductive metallic material, however, it is also possible to print a conductive material onto a plastic film in the desired shape for use as the lead frame 20. The plastic film may then be laminated to the nonconductive substrate in substantially the same manner as a more conventional metallic lead frame.

Other embodiments and modifications of the invention will occur to those skilled in the art which are within the scope of the present invention.

I claim:

1. An inetgrated circuit module adapted to connect an IC chip to a printed circuit board edge connector, comprising:
   a nonconductive substantially planar circuit board substrate having first and second surfaces and a contact edge for connection to the printed circuit board edge connector;
   a conductive lead frame having a first set of leads laminated to the first surface of the substrate and a second set of leads wrapped around an edge of the substrate and laminated to the second surface of the substrate, said first and second set of leads having inner tips for connection to the IC chip and outer contact ends for contacting the printed circuit board edge connector;
   wherein the contact ends of the first set of leads are laminated to the first surface of the substrate in spaced relation along the contact edge, and the contact ends of the second set of leads are laminated to the second surface of the substrate in spaced relation long the contact edge; and
   whereby the contact ends of the first and second set of leads are presented along the contact edge for contacting the printed circuit board edge connector.

2. The integrated circuit module of claim 1 wherein the lead frame further includes a shield means laminated to the second surface of the substrate and positioned beneath the inner tips of the leads for shielding the IC chip.

3. The integrated circuit module of claim 1 wherein the contact ends of the leads are wider than the remaining portions of the leads thereby providing a larger contact surface for contacting the electrical connector.

4. The integrated circuit module of claim 1 further including:
   an IC chip;
   means for electrically connecting the IC chip to the inner tips of the leads in the lead frame; and
   means for hermetically sealing the IC chip.

5. The integrated circuit module of claim 4 wherein:
the means for hermetically sealing the IC chip comprises an encapsulating medium surrounding the IC chip; and
the first surface of the substrate includes a depression formed therein which receives the portion of the encapsulating medium which lies below the first set of leads.

6. The integrated circuit module of claim 1 wherein:
the first surface of the substrate contains a depression for holding the IC chip; and
the inner tips of the leads are bent into the depression in the first surface of the substrate.

7. The integrated circuit module of claim 6 further including:
an IC chip mounted within the depression;
means for electrically connecting the IC chip to the inner tips of the leads in the lead frame; and
means for hermetically sealing the IC chip within the depression.

8. The integrted circuit module of claim 7 wherein:
the lead frame further includes an IC mounting base bent down into the depression; and
the IC chip is mounted on the IC mounting base.

9. The integrated circuit module of claim 7 wherein:
the IC chip and the means for electrically connecting the IC chip lie entirely within the depression; and
the means for hermetically sealing the IC chip comprises a sealing member positioned over the top of the depression and hermetically sealed to the first surface of the substrate around the perimeter of the depression.

10. The integrated circuit module of claim 9 wherein the sealing member comprises:
a conductive plate connected to a lead of the lead frame and hermetically sealed around the perimeter of the depression with a non conductive adhesive to prevent contact between the conductive plate and the remaining leads of the lead frame; and
a nonconductive filling material, filling the depression below the conductive plate.

11. The integrated circuit module of claim 9 wherein:
the depression contains a first level and a second level;
the inner tips of the leads are bent down into the depression and laminated to the first level; and
the IC chip is mounted on the second level with its upper surface substantially coplanar with the inner tips of the leads.

12. The integrated circuit module of claim 11 wherein:
the lead frame further includes an IC mounting base bent down into the depression and mounted on the second level; and
the IC chip is mounted on the IC mounting base with a conductive material.

13. The integrated circuit module of claim 1 wherein the leads are laminated to the first surface of the substrate with an adhesive.

14. The integrated circuit module of claim 1 wherein the conductive lead frame pattern is printed onto the surface of a nonconductive film with a conductive material, said film being laminated to the first surface of the substrate.

15. A method of fabricating an integrated circuit module adapted to connect an IC chip to a printed circuit board edge connector comprising the steps of:

(a) forming a nonconductive substantially planar circuit board substrate having first and second surfaces and a contact edge for connection to the printed circuit board edge connector;
(b) positioning a conductive lead frame having first and second sets of leads with inner tips for connection to the IC chip and outer contact ends for contacting the printed circuit board edge connector on the first surface of the substrate with the contact ends of the first set of leads in spaced relation along the contact edge of the substrate;
(c) laminating the first set of leads to the first surface of the substrate;
(d) wrapping the second set of leads around a noncontact edge of the substrate;
(e) positioning the second set of leads on the second surface with the contact ends of the second set in spaced relation along the contact edge of the substrate; and
(f) laminating the second set of leads to the second surface of the substrate.

16. The method of claim 15 wherein step (b) includes providing a lead frame having a shield means; step (e) includes positioning the shield means on the second surface beneath the inner tips of the leads; and step (f) includes laminating the shield means to the second surface.

17. The method of claim 15 wherein step (b) includes providing a lead frame with leads which have contact ends which are wider than the remaining portions of the lead.

18. The method of claim 15 further including the steps of:
(g) mounting an IC chip on the lead frame;
(h) electrically connecting the IC chip to the inner tips of the leads in the lead frame; and
(i) hermetically sealing the IC chip.

19. The method of claim 18 wherein step (a) includes forming a depression in the first surface of the substrate; and (i) includes sealing the IC chip by surrounding it with an encapsulating medium, the portion of said encapsulating medium which lies below the leads of the lead frame being dimensioned to fit within the depression in the first surface of the substrate.

20. The method of claim 15 wherein step (a) includes forming a depression in the first surface of the substrate for holding the IC chip; and the method further includes the step of:
(j) bending the inner tips of the leads into the depression.

21. The method of claim 20 further including the steps of:
(k) mounting an IC chip within the depression;
(l) electrically connecting the IC chip to the inner tips of the leads in the lead frame, and
(m) hermetically sealing the IC chip within the depression.

22. The method of claim 21 wherein step (b) includes providing a lead frame with an IC mounting base; step (j) includes bending the mounting base into the depression; and step (k) includes mounting the IC chip on the mounting base.

23. The method of claim 21 wherein step (m) includes positioning a sealing member over the top of the depression and hermetically sealing the sealing member to the first surface of the substrate around the perimeter of the depression.

24. The method of claim 23 wherein the sealing member of step (m) comprises a conductive plate; and the method further includes the steps of:
   (n) applying a nonconductive adhesive to the conductive plate prior to step (m) to hermetically seal the IC chip and prevent the conductive plate from contacting all of the leads around the perimeter of the depression; and
   (o) connecting the conductive plate to at least one lead.

25. The method of claim 23 wherein step (a) includes forming a first and second level in the depression; step (c) includes laminating the inner tips of the leads to the first level of the depression; and step (k) includes mounting the IC chip on the second level with its upper surface substantially coplanar with the inner tips of the leads.

26. The method of claim 25 wherein step (b) includes providing a lead frame with an IC mounting base; step (j) includes bending the mounting base into the second level of the depression; and step (k) includes mounting the IC chip on the mounting base with a conductive material.

27. The method of claim 15 wherein step (c) includes laminating the leads to the substrate with an adhesive.

28. An integrated circuit module adapted to connect an IC chip and at least one external electrical component to a printed circuit board edge connector, comprising:
   a nonconductive substantially planar printed circuit board substrate having a contact edge for connection to the printed circuit board edge connector;
   a conductive lead frame having a plurality of leads laminated to the substrate, said lead frame having leads with inner tips for connection to the IC chip and outer contact ends for contacting the printed circuit board edge connector, at least one of the leads of the lead frame having a means for mounting the external electrical component.

29. The integrated circuit module of claim 28 wherein:
   the means for mounting the electrical component comprises a contact pad with a hole contained therein laminated to the substrate and
   the substrate contains a hole in alignment with the hole in the contact pad for the reception of a lead of the external electrical component.

30. The integrated circuit module of claim 28 wherein the integrated circuit module is adapted to connect a plurality of external electrical components to the electrical connector, the lead frame includes a plurality of leads having a means for mounting the external electrical components, and the lead frame further comprises circuit wiring means laminated to the substrate for the interconnection of the external electrical components.

* * * * *

UNITED STATES PATENT AND TRADEMARK OFFICE
CERTIFICATE OF CORRECTION

PATENT NO. : 4,567,545
DATED : January 28, 1986
INVENTOR(S) : Rollin W. Mettler, Jr.

It is certified that error appears in the above-identified patent and that said Letters Patent are hereby corrected as shown below:

In column 6, line 36, "contnact" should read --contact--.

In column 10, line 29, "inetgrated" should read --integrated--.

In column 11, line 21, "integrted" should read --integrated--.

Signed and Sealed this

Twentieth Day of May 1986

[SEAL]

Attest:

DONALD J. QUIGG

Attesting Officer

Commissioner of Patents and Trademarks